US011775370B2

(12) United States Patent
Roberts

(10) Patent No.: US 11,775,370 B2
(45) Date of Patent: *Oct. 3, 2023

(54) MEMORY FAULT MAP FOR AN ACCELERATED NEURAL NETWORK

(71) Applicant: Micron Technology, Inc., Boise, ID (US)

(72) Inventor: David Andrew Roberts, Wellesley, MA (US)

(73) Assignee: Micron Technologies, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/054,019

(22) Filed: Nov. 9, 2022

(65) Prior Publication Data

US 2023/0114921 A1  Apr. 13, 2023

Related U.S. Application Data

(63) Continuation of application No. 16/846,259, filed on Apr. 10, 2020, now Pat. No. 11,507,443.

(51) Int. Cl.
| G06F 11/00 | (2006.01) |
| G06F 11/07 | (2006.01) |
| G06N 3/08 | (2023.01) |
| G06F 11/10 | (2006.01) |

(52) U.S. Cl.
CPC ........ *G06F 11/073* (2013.01); *G06F 11/1068* (2013.01); *G06N 3/08* (2013.01)

(58) Field of Classification Search
CPC ............... G06F 11/073; G06F 11/1068; G06F 11/1084; G06F 11/10; G06F 11/3034; G06F 11/3037; G06F 11/3058; G06N 3/08

See application file for complete search history.

(56) References Cited

U.S. PATENT DOCUMENTS

| 8,145,960 B2 | 3/2012 | Mudge et al. |
| 8,230,277 B2 | 7/2012 | Mudge et al. |
| 11,507,443 B2 | 11/2022 | Roberts et al. |

(Continued)

FOREIGN PATENT DOCUMENTS

WO  2021206827  10/2021

OTHER PUBLICATIONS

"International Preliminary Report on Patentability", Application No. PCT/US2021/020300, dated Oct. 6, 2022, 7 pages.

(Continued)

*Primary Examiner* — Joseph D Manoskey
(74) *Attorney, Agent, or Firm* — Colby Nipper PLLC

(57) ABSTRACT

Methods, systems, and apparatuses related to a memory fault map for an accelerated neural network. An artificial neural network can be accelerated by operating memory outside of the memory's baseline operating parameters. Doing so, however, often increases the amount of faulty data locations in the memory. Through creation and use of the disclosed fault map, however, artificial neural networks can be trained more quickly and using less bandwidth, which reduces the neural networks' sensitivity to these additional faulty data locations. Hardening a neural network to these memory faults allows the neural network to operate effectively even when using memory outside of that memory's baseline operating parameters.

20 Claims, 9 Drawing Sheets

(56) References Cited

U.S. PATENT DOCUMENTS

| | | |
|---|---|---|
| 2009/0055680 A1 | 2/2009 | Honda et al. |
| 2013/0151914 A1 | 6/2013 | Cadigan et al. |
| 2019/0065338 A1* | 2/2019 | Bramley ............. G06F 11/3419 |
| 2019/0095299 A1* | 3/2019 | Liu ........................ G06N 20/00 |
| 2019/0235940 A1 | 8/2019 | Kegel et al. |
| 2020/0117997 A1* | 4/2020 | Yao ........................ G06N 3/063 |
| 2020/0380369 A1 | 12/2020 | Case et al. |
| 2021/0125053 A1 | 4/2021 | Faibish |
| 2021/0158143 A1 | 5/2021 | Baughman et al. |
| 2021/0286714 A1 | 9/2021 | Hicks et al. |
| 2021/0294791 A1 | 9/2021 | Narayanaswamy et al. |
| 2021/0318922 A1 | 10/2021 | Roberts |
| 2021/0390414 A1 | 12/2021 | Schneider et al. |
| 2022/0035684 A1 | 2/2022 | Gupte et al. |

OTHER PUBLICATIONS

"International Search Report and Written Opinion", Application No. PCT/US2021/020300, dated Jun. 28, 2021, 11 pages.

"Non-Final Office Action", U.S. Appl. No. 16/846,259, dated Mar. 25, 2022, 11 pages.

"Notice of Allowance", U.S. Appl. No. 16/846,259, dated Jul. 15, 2022, 5 pages.

Koppula, et al., "EDEN—Enabling Energy-Efficient, High-Performance Deep Neural Network Inference Using Approximate DRAM", Session 2A: Accelerators for Machine Learning; In Proceedings of the 52nd Annual IEEE/ACM International Symposium on Microarchitecture, Oct. 12, 2019, 16 pages.

Liu, et al., "Rescuing Memristor-based Neuromorphic Design with High Defects", Jun. 2017, 6 pages.

Nair, et al., "FAULTSIM: A Fast, Configurable Memory-Reliability Simulator for Conventional and 3D-Stacked Systems", ACM Trans. Archit. Code Optim. 12, 4, Article 44, Dec. 2015, 24 pages.

Roberts, et al., "On-Chip Cache Device Scaling Limits and Effective Fault Repair Techniques in Future Nanoscale Technology", University of Michigan, Intel Corporation, Oct. 2007, 9 pages.

Wang, et al., "Overcoming Computational Errors in Sensing Platforms Through Embedded Machine-Learning Kernels", Aug. 2014, 12 pages.

Xia, et al., "Fault-Tolerant Training with On-Line Fault Detection for RRAM-Based Neural Computing Systems", Jun. 2017, 6 pages.

* cited by examiner

MEMORY FAULT MAP FOR AN ACCELERATED NEURAL NETWORK

RELATED APPLICATION

This application is a continuation of, and claims priority to, U.S. Utility patent application Ser. No. 16/846,259, filed on Apr. 10, 2020, which is incorporated herein by reference in its entirety.

BACKGROUND

Artificial neural networks have proven useful in many applications due to their ability to reproduce and model nonlinear processes. Example uses include object recognition, email spam filtering, system control, and medical diagnostics. Because artificial neural networks are increasingly prevalent, ways in which to improve their execution and training have also proliferated. These improvements include neural network accelerators, which use computer hardware designed specifically to work with artificial neural networks.

BRIEF DESCRIPTION OF THE DRAWINGS

The details of one or more aspects of a memory fault map for an accelerated neural network are described in this document with reference to the following drawings. The same numbers are used throughout the drawings to reference like features and components:

FIG. 1-2 illustrates example operational implementations for the fault module illustrated in FIG. 1-1.

FIG. 2 illustrates example capabilities of the fault module illustrated in FIGS. 1-1 and 1-2.

DETAILED DESCRIPTION

Overview

Figure 1:
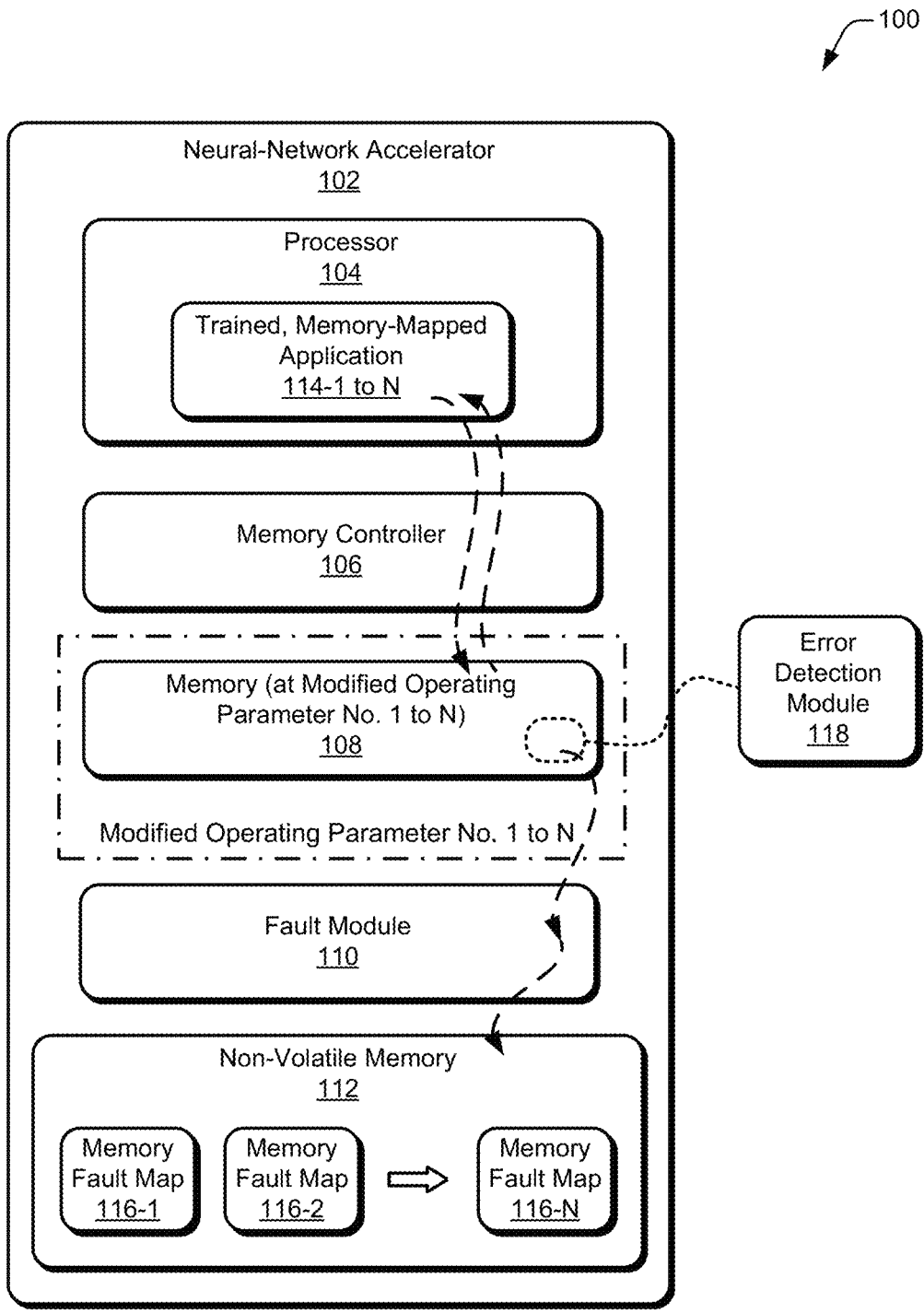
FIG. 1-1 illustrates an example environment in which techniques for creation and/or use of a memory fault map for an accelerated neural network can be implemented.

This document describes a memory fault map for accelerated neural networks. An artificial neural network can be accelerated by operating memory outside of the memory's baseline operating parameters. Doing so, however, often increases the amount of faulty data locations in the memory. Through creation and use of the disclosed fault map, however, artificial neural networks can be trained to reduce the numerical significance of erroneous data values, which reduces the neural networks' sensitivity to these additional faulty data locations. Training a neural network to these memory faults allows the neural network to operate effectively even when using memory outside of that memory's baseline operating parameters.

Consider, for example, a neural network accelerator designed to accelerate an artificial neural network (also referred to as a "neural network" for brevity). This neural network accelerator can be implemented by, for example, the processor of a host device or the circuitry of a memory device. Because neural networks can be highly memory dependent, the accelerator can improve performance by modifying operating parameters of the memory (e.g., increase the frequency of memory operations or reduce voltage used by the memory). These performance improvements, however, use modified operating parameters for the memory, which, as noted above, are outside the memory's baseline operating parameters and therefore often increase memory faults. Some neural network implementations are intrinsically fault-tolerant, meaning they can operate even if there are some flaws in their model or the memory on which their model relies. The described memory fault map can be used to train or retrain (e.g., harden) the neural network to reduce reliance of portions of the neural network's model that are associated with a fault in memory. By so doing, the now-hardened neural network can operate using a memory at higher performance or at conditions outside the memory's baseline operating parameters.

Consider an alternative neural network accelerator that includes a smaller, cheaper, or less-complex structure that is designed to operate within a memory's baseline operating parameters. Here, assume that the neural network accelerator includes a memory, a memory controller, and a computer processor, but further assume that the neural network accelerator is designed to use the described memory fault map. This alternate design, because of the memory fault map, can be designed to be smaller, cheaper, or with fewer components. Some components, and their accompanying size and costs, can be avoided, such as some error-correction components and redundancies needed to avoid or correct memory faults (knowledge of error locations is still used, but correction is not). This is permitted because the memory fault map can be used to harden a neural network to memory faults, thereby permitting faults with which many applications (that are not tolerant to faults in memory) could not reliably operate. Thus, the memory fault map can also be used to train a neural network for use with a memory that has numerous faults when operated within the memory's baseline operating parameters. This permits use of less-expensive or higher-performance memories or accelerator structures.

Similarly, consider use of a fast and dense memory that, while superior in that it is fast and dense, may have higher quantities of faults. In such a case, this fast-and-dense memory, which offers higher speed and reduced real estate, can still be used for applications, such as neural networks, if those applications are trained using the memory fault map and can be made at least somewhat tolerant to faults in memory to which the application is mapped.

In contrast to the memory fault map disclosed herein, another way in which to store these errors is as a list of error locations, e.g., each error location listed as a separate address at which each faulty bit is located. This list includes a full bit-level fault table, which slows or makes impractical training of a neural network, as the time and resources to access and store this list are prohibitive. In contrast, the memory fault map can store multiple error locations, even error locations along one, two, or three dimensions, as a single entry. For example, a region, such as a half of a column of memory in a two-dimensional memory, can be stored with a single entry by the memory fault map, thereby reducing the overhead for the memory fault map. Furthermore, when training a neural network, the memory fault map permits fast and efficient indication of portions of the neural network mapped to those error locations. With this fast-and-efficient way in which to determine the portions of the neural network associated with a memory fault, the training adjusts attributes of the neural network to deemphasize use of faulty memory locations. Example neural network attributes that can be adjusted include network structure (e.g., the types and number of layers or the interconnections of nodes), weights of nodal connections, and biases. For instance, training can reduce weights and/or biases of nodes of the neural network mapped to an address with the single entry of the memory fault map. By so doing, training the neural network, even multiple times for different memories and different operating parameters, can be performed quickly and with reduced storage needs.

Consider an environment in which a memory fault map for accelerated neural networks is implemented in a distributed manner across a memory and a host having a memory controller and a computer processor. The host includes a neural network accelerator module that can train a neural network using a memory fault map. The neural network accelerator module can also operate the trained neural network based on an associated operating parameter. In this architecture, the memory implements a fault module to produce the memory fault map based on observed memory faults. The host then obtains the memory fault map from the memory.

By implementing the fault module at the memory, the fault module is close to the memory to detect and investigate faults and to record the resulting fault regions into a memory fault map. The fault module can then condense each of the recorded fault regions into an indication of a single-entry fault range to transform the memory fault map into a memory fault map having a reduced size. By producing the memory fault map at the memory, the memory fault information occupies less space and can therefore be easily transmitted over the interconnect from the memory to the host. This saves bandwidth between the host and the memory. Further, the host can be simplified because it does not need to understand the low-level aspects of the memory architecture, the information of which is used to investigate detected faults and create the memory fault map. Instead, the neural network accelerator module at the host can merely request the memory fault map from the memory and then use it to accelerate a neural network at an associated operating parameter.

These are but a few examples of how a memory fault map for accelerated neural networks can be implemented. Other examples and implementations are described throughout this document. The document now turns to an example operating environment, after which example devices and methods are described.

Operating Environment

FIG. 1-1 illustrates an example environment 100 in which various techniques and devices described in this document can operate. This environment 100 assumes prior creation of a memory fault map using a fault module and prior training of a memory-mapped application, such as a neural network. Once trained, the trained, memory-mapped application is executed using a neural network accelerator. While prior actions are assumed, this environment 100 shows one example result of using the described memory fault map to reduce a neural network's sensitivity to faulty data locations, such as those caused by using memory outside of that memory's baseline operating parameters.

In more detail, the environment 100 illustrates a neural-network accelerator 102, one or more computer processors 104, a memory controller 106, a memory 108, a fault module 110, and non-volatile memory 112. The computer processor 104 executes an application at a modified operating parameter where the application is trained to compensate for errors in the memory 108 at that operating parameter. This is illustrated with a trained, memory-mapped application 114-1 to 114-N, with 1 to N representing one to some integer, N, of operating parameters. As used herein, a memory-mapped application refers to an application for which memory addresses of the application, or portions thereof, are known or pre-determined. The application is trained with a respective memory fault map 116-1 to 116-N, with 1 to N representing the operating parameters. The computer processor 104 executes the trained, memory-mapped application 114 and, through the memory controller 106, read from and write to the memory 108. While the one or more processors 104 are illustrated as a processor configured for execution of a neural network, the processors 104 may instead include a host computer device's CPU or GPU, or others.

The memory 108 is illustrated as a main memory for a neural-network accelerator, e.g., neural-network accelerator 102; the memory 108, however, can be separate from an accelerator and be of various types. For example, the memory 108 can include an integrated circuit memory, dynamic or static random-access memory (e.g., DRAM, SRAM), or Flash memory, or the like. Any memory having knowable locations of physical memory faults can be used.

The fault module 110 is shown integral with the neural-network accelerator 102, but it may be separate from the neural-network accelerator 102, or integral with a portion thereof, such as the memory controller 106 or the memory 108. Example locations for implementing the fault module 110 are described below with reference to FIG. 1-2. Each of the modules described herein may include computer-readable media having processor-executable instructions in software, hardware, firmware, or a combination thereof.

Before describing each element of environment 100 in greater detail, consider one alternative or additional way to create or improve the memory fault map 116. Here, an error detection module 118 indicates faults in the memory 108 when being operated at one of the modified operating parameters and passes these faults to the fault module 110 (illustrated with a dashed-line arrow). The fault module 110 may then alter, or record and later alter, the appropriate memory fault map for that operating parameter for storage in the non-volatile memory 112 (illustrated with another dashed-line arrow).

Figures 1, 2:
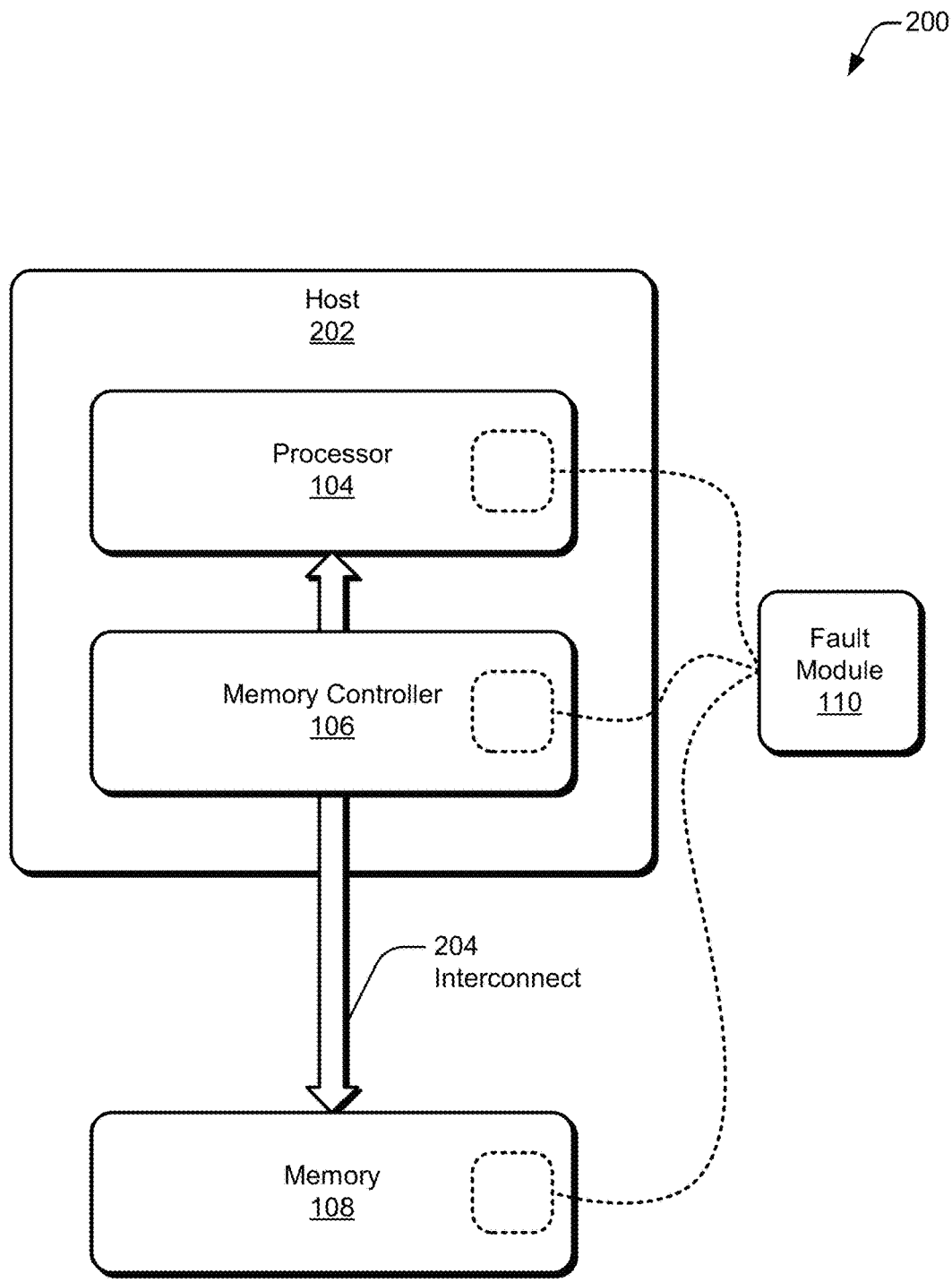
Figure 2:
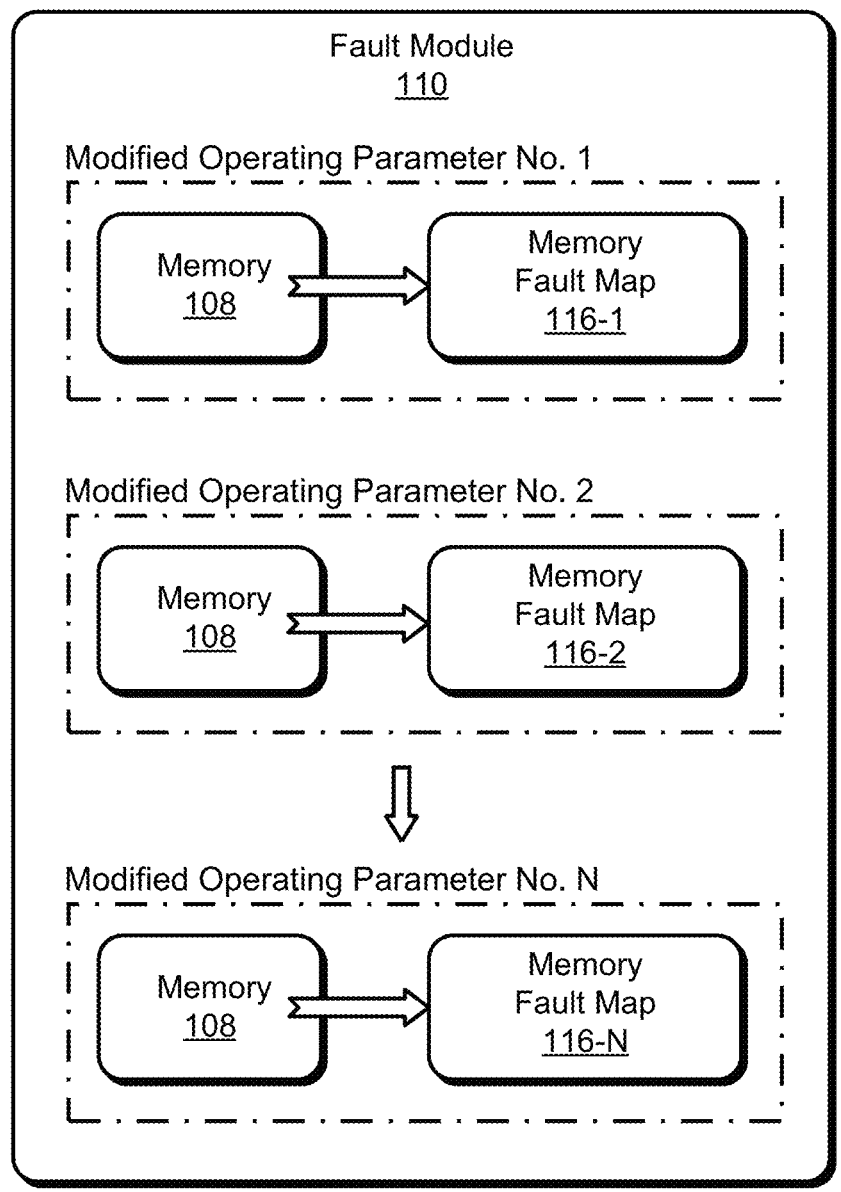

FIG. 1-2 illustrates example operational implementations for the fault module 110 that is illustrated in FIG. 1-1. An example apparatus 200 includes at least one host 202 and at least one memory 108. The host 202 includes at least one processor 104 and at least one memory controller 106. The processor 104 and memory controller 106 may be physically separate devices (e.g., separate chips or chiplets) or may be different elements of a single device, such as a CPU, ASIC, or FPGA. The host 202 is coupled to the memory 108 using an interconnect 204. For example, the processor 104 can be communicatively coupled to the memory 108 via the interconnect 204 using the memory controller 106. The interconnect 204 can be realized using an on-chip interconnect, an inter-chip interconnect, a bus, a trace on a printed circuit board (PCB), a cable, or a switching fabric, just to name a few examples.

The fault module 110, or multiple such fault modules, can be positioned for execution in one or more locations of the apparatus 200. As shown, the fault module 110 can be positioned at the processor 104, the memory controller 106, or the memory 108. The fault module 110 can alternatively be in one or more other locations. Further, the fault module 110 can be distributed across two or more components, such as the memory 108 and the processor 104 or the memory controller 106 and the processor 104. Example implementations in which the memory 108 includes at least part of the fault module 110 are described below with reference to FIGS. 5 and 6.

Example Fault Module

FIG. 2 illustrates example capabilities of the fault module 110 of FIGS. 1-1 and 1-2. The fault module 110 is configured to create the memory fault map 116 of FIG. 1-1. This memory fault map 116 is intended for future training of a memory-mapped application, such as a neural network application, with each of the memory fault maps 116-1 to N associated with a particular operating parameter (1-N) and a particular memory, such as the memory 108. Thus, if multiple memories are intended to be used, multiple memory fault maps 116 can be created by the fault module 110. Capabilities of the fault module 110 are shown within a dash-line box, with creation of memory fault maps shown with arrows from the memory 108 (at different modified operating parameters) to corresponding memory fault maps 116.

Determining Physical Memory Faults

The fault module 110 is configured to create the memory fault map 116 by determining multiple addresses for multiple physical memory faults in the memory 108. These physical memory faults are determined when the memory 108 is operated at a modified operating parameter that is different from a baseline operating parameter of the memory 108. These determinations can be performed prior to execution of an application or during execution through errors being detected by the error-detection module 118, which are then passed to the fault module 110 (see FIG. 1-1).

Here, a baseline operating parameter is a particular parameter or range of an operating parameter at which a manufacturer of the memory specifies the memory can be operated at a given level of reliability. With baseline operating parameters, memory manufacturers could test the memory before sale, create error fault lists (should there be any errors), and, in some cases, guarantee very low or zero errors (other than listed errors) when the memory is operated at the prescribed baseline operating parameters. Thus, the multiple physical memory faults determined while the memory 108 is operated at the modified operating parameter include faults in addition to those found in a baseline fault list associated with the memory 108 while operated within the baseline operating parameter.

Example modified operating parameters include a high-frequency memory access, a low-voltage memory storage, a low refresh rate, a data scrubbing operation, and a high-temperature operation. The high-frequency memory access is higher than a specified baseline-frequency memory access of the memory, where the baseline-frequency memory access is a frequency access at which the memory is designed to operate within bounded error rates. As noted elsewhere herein, operating a memory at a higher frequency can increase faults in a memory, but can also increase speed of operation, and therefore performance. For example, a high-frequency memory access can include clock cycles that are five, ten, or twenty percent faster than the baseline frequency access for the memory.

The low-voltage memory storage is lower than a baseline-voltage memory storage of the memory, where the baseline-voltage memory storage is a voltage at which the memory is designed to operate within bounded error rates. Using lower voltage for memory storage can save power and improve performance but can increase faults in a memory. These additional faults are encoded in the memory fault map 116 by the fault module 110. Example reduced voltages are 0.8 volts and 1.2 volts, where baseline voltages are instead in a range of 1.2 to 1.8 volts.

Other modified operating parameters include operating the memory 108 at temperatures above the baseline temperature range, which can increase performance or save power (e.g., by not requiring time to cool down the memory, or power to operate a temperature-reduction device).

The fault module 110 may determine multiple addresses for multiple physical memory faults in various manners. For example, the fault module 110 can determine fault addresses by testing addresses adjacent to a known error to determine a physical bound to an error region. This determination can be from an address known to have a fault, such as from the baseline fault list or prior operation of the fault module 110.

In one case the fault module 110 tests adjacent addresses, one bit at a time, with each bit neighboring a known fault address until a non-error bit is determined at each bound of a same column of the memory, a same row or sense circuitry of the memory, a same program circuitry of the memory, a bank of the memory, a same refresh circuitry of the memory, or addresses along a same via of the memory in which the location having the determined fault resides. One way in which to proceed bit-by-bit is by testing neighboring (adjacent or within row/column/bank) bits in a column, then row buffer, then bank, and then channel. To expedite the process, the fault module 110 can instead skip some bits before testing another bit. The result of this testing can be that a portion or all of a row, column, bank, via region, and so forth is found to be an error region, and thus should be represented in the memory fault map 116.

Alternatively, the fault module 110 may test for an error region by testing some addresses within a region of a known fault address (an "error location") of the multiple physical memory faults to determine if other faults are within the region. If the number of the other faults exceeds a number or percentage threshold, the fault module 110 represents this determined region as an error region in the memory fault map 116.

Encoding Physical Memory Faults

With multiple physical memory faults determined, the fault module 110 is configured to encode an address range in the memory fault map 116. This address range includes at least two of the multiple addresses of the multiple physical memory faults determined to be in the memory 108. For a visual explanation, consider FIG. 3.

Figure 3:
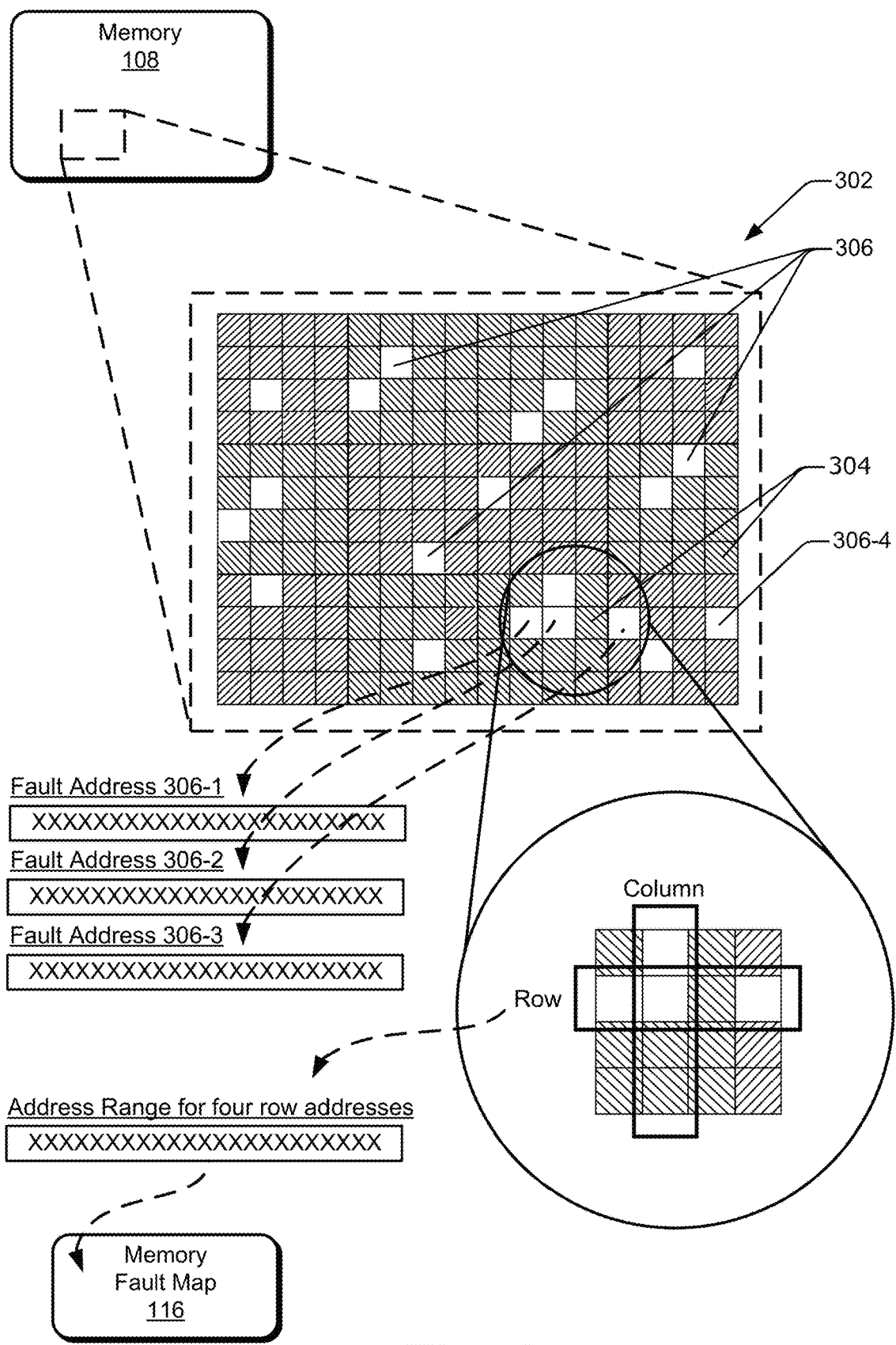
FIG. 3 illustrates a simplified visual representation of a memory, as one example of the memory illustrated in FIGS. 1-1 and 1-2.

FIG. 3 illustrates a simplified visual representation of a memory, here the memory 108 shown with a portion 302 expanded to show bit-level memory locations with both non-fault addresses 304 and fault addresses 306. As illustrated with address range 308, a single map entry in the memory fault map 116 can be encoded that covers four addresses: three fault addresses 306-1, 306-2, and 306-3, as well as one non-fault address 304. The address range 308 therefore includes at least two of the multiple addresses of the multiple physical memory faults determined to be in the memory 108. The address range 308 in effect includes bounds of the error region, such as indicating an outer bound indicating a starting address for a row and some indicator (also called a "mask") for how many additional bits around the starting address are included in the error region (here four bits, inclusive). Additionally, the error region represented by the address range 308 includes at least one bit not determined to be a physical memory fault. Including bits not determined to be faulty (called "non-fault bits"), while sacrificing some available memory, saves both storage space for the memory fault map 116 and speeds up training, as noted below. This is one example of an error region, here having three errors out of four possibilities, that is encoded as a single entry. This has benefits outside the reduced size of the memory fault map 116, which are described later below. In this example of the address range 308, the encoding includes two integers, one for a starting physical location and another to set an ending physical location.

In some cases, the memory fault map 116 is created progressively as fault addresses are found, such as when a fault map is altered during execution of an application or through encoding address ranges while fault testing is performed. This is shown in part in FIG. 1-1 with the error detection module 118 detecting errors and passing them to the fault module 110. As a fault address is found, however, the fault module 110 may avoid adding another entry in the memory fault map 116. Assume that an error is detected having a fault address 306-4. The fault module 110, rather than encode a new address range, may instead alter the address range 308 to extend the outer bound to include the fault address 306-4.

Similarly, an intersection of a fault address can be determined by the fault module 110 against an existing address range. The intersection shares a mask address (e.g., a row or column) but may or may not be within bounds of the mask address. Thus, when an intersection is found, the fault module 110 can simply ignore the new fault address if it is within the bound or, if it is not, alter the existing address range to encompass the fault address. For example, if at some future time the non-fault address between fault addresses 306-2 and 306-3 were determined to be a fault address, the fault module 110 can determine the intersection and forgo or alter an existing address range, thereby either not altering the memory fault map 116 or altering but not adding another address range.

A computing system (e.g., the apparatus 200 of FIG. 2) may include other technologies that counteract a faulty memory. Some systems may include modules or circuitry that attempt error correction, repair, and/or re-mapping of data to mitigate memory faults that can impact operation of the host. Thus, a memory fault map 116 may be created under a fixed operating condition that results from such a fault mitigation scheme being applied before uncorrectable physical memory faults are determined and encoded to generate the memory fault map 116. For example, hardware or software error correcting/correction code (ECC) and related repair techniques can make a first attempt to reduce a quantity of memory errors. The remaining uncorrectable memory error locations are then encoded into the memory fault map.

Returning to FIG. 2, the fault module 110 is configured to associate the memory fault map 116 to the modified operating parameter at which the faults in the memory 108 were determined. Based on this association, future training can be performed for the appropriate modified operating parameter and memory. The memory fault map 116 can be used, as illustrated in FIG. 4 below, in training a memory-mapped application to compensate for and reduce sensitivity to the multiple physical memory faults at the modified operating parameter.

Training a Memory-Mapped Application

Figure 4:
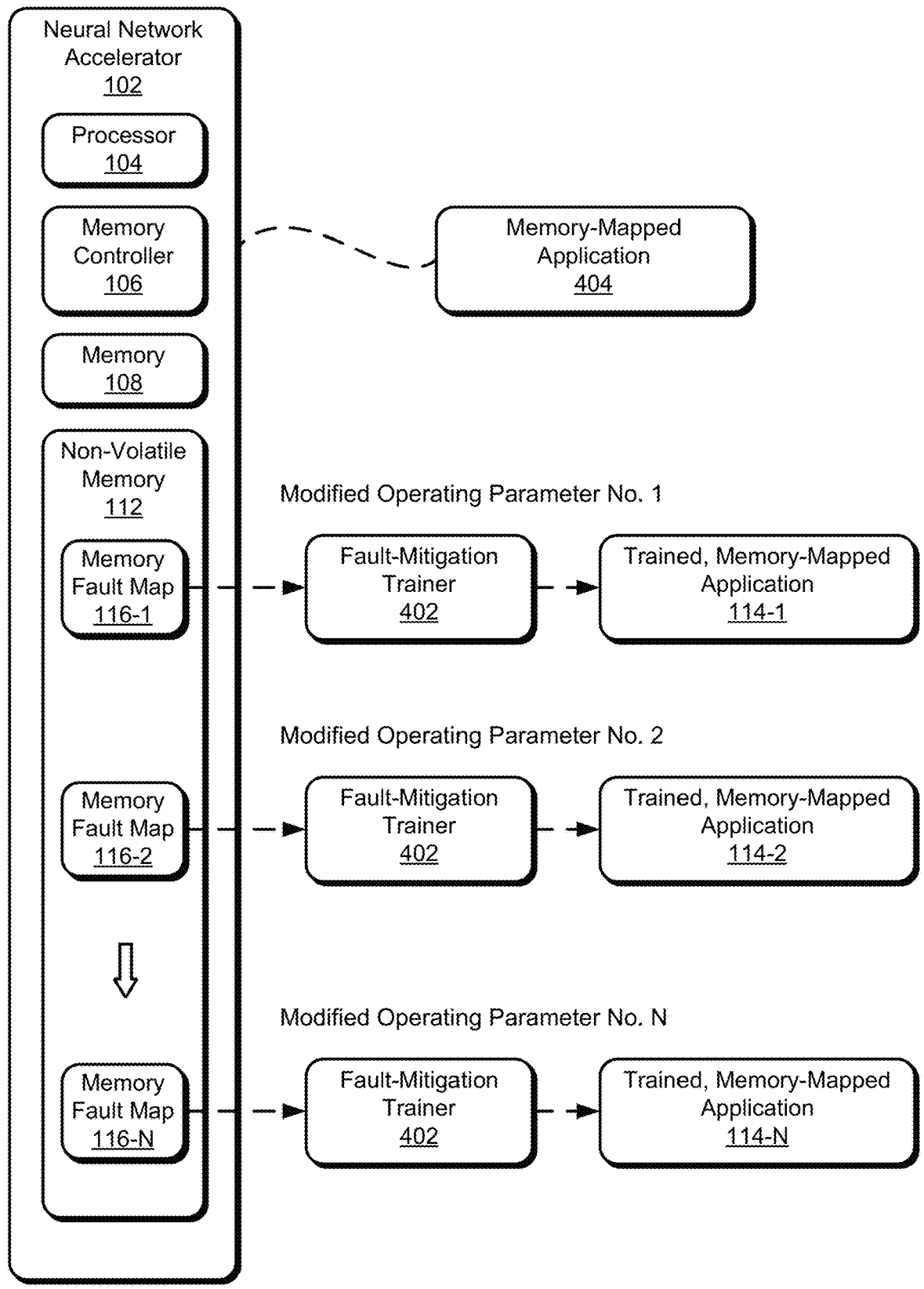
FIG. 4 illustrates capabilities of an example fault-mitigation trainer, which is configured to train a memory-mapped application using the memory fault map illustrated in FIGS. 1-1 to 3.

FIG. 4 illustrates capabilities of a fault-mitigation trainer 402, which is configured to train a memory-mapped application 404 using the memory fault map 116 created by the fault module 110 of FIGS. 1-1 to 3. Other components of FIGS. 1-1 to 3 are also included for context. The fault-mitigation trainer 402 is configured to select a memory fault map associated with an operating parameter, train a memory-mapped application using the memory fault map, and then associate the trained application to that operating condition (and in some cases a memory if there is more than one used by an accelerator).

In more detail, the fault-mitigation trainer 402 is configured to select a memory fault map 116-1 to N, where each of the fault maps 116 is associated with a different modified operating parameter, 1 to N, for the memory 108. Thus, for each of the possible modified operating parameters, such as high frequency or low voltage, an associated memory fault map 116 is selected.

With the selected memory fault map 116, the fault-mitigation trainer 402 is configured to train the memory-mapped application 404 to compensate for faults in the memory 108, resulting in a trained version of the memory-mapped application 404, here trained, memory-mapped applications 114-1 to N. This training of the memory-mapped application 404 trains the memory-mapped application 404 to multiple physical memory faults represented in the memory fault map 116. This training hardens the application by retraining one or more neural-network nodes of the memory-mapped application.

While not required, the memory-mapped application 404 can be a neural network, such as a deep neural network. To harden the deep neural network, the fault-mitigation trainer 402 is configured to retrain at least one attribute of the deep neural network, such as a network structure (e.g., the types and number of layers or the interconnections between nodes), the weights of nodal connections, and/or the biases. For example, the fault-mitigation trainer 402 can retrain one or more neural-network nodes by altering weights of multiple neural-network nodes having a fixed mapping to faults in the memory represented by the address ranges in the memory fault map 116.

The training can be faster or use fewer resources through identification of intersections between address ranges within the memory fault map 116 and locations in the memory 108 to which neural-network nodes of the memory-mapped application 404 include a fixed mapping. These intersections indicate that the neural-network node is associated with some portion of the memory that has faults. By so doing, the node's weight (or other manners, depending on the type of memory-mapped application) can be reduced to reduce the effect of the faulty memory. This intersection, as noted above, can be fast and efficient, even being a single-level comparison performed by hardware or software.

While this example of training is concerned with fixed-memory mapping between an application and a physical location in a memory, a virtual memory can still be used during training and execution, such as for security purposes. So long as the application is trained and executed using the same physical addresses, then the training is effective, as the physical location of a fault in memory is still mapped to a part (e.g., node) of the application, though in this case also through a virtual mapping.

Figure 5:
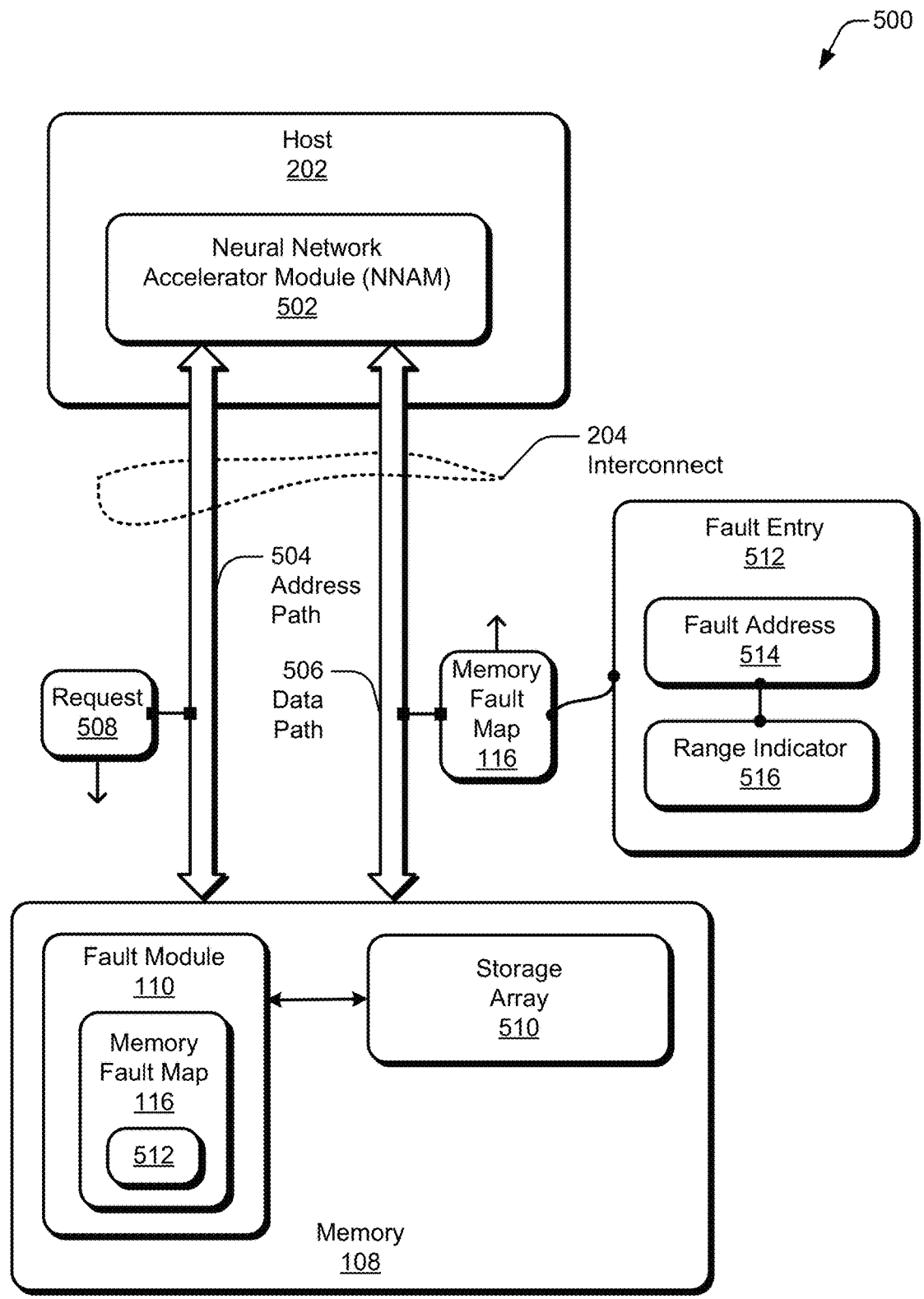
FIG. 5 illustrates operation of an example architecture in which a memory fault map for an accelerated neural network can be implemented.

FIG. 5 illustrates operation of an example architecture and scheme for an apparatus 500 in which a memory fault map for an accelerated neural network can be implemented. As shown, the apparatus 500 includes the host 202 and the memory 108. The host 202 includes a neural network accelerator module 502. The memory 108 includes the fault module 110 and a storage array 510, and the fault module 110 includes the memory fault map 116. The interconnect 204 includes an address path 504 and a data path 506. The neural network accelerator module 502 can perform the operations described above with reference to FIG. 4 to produce a trained, memory-mapped application 114 from a memory-mapped application 404 using a memory fault map. Here, the fault module 110 is instantiated at the memory 108 and therefore produces the memory fault map 116 away from the host 202 and the neural network accelerator module 502.

The scheme depicts a process for transferring the memory fault map 116 from the fault module 110 at the memory 108 to the neural network accelerator module 502 at the host 202. The fault module 110 has proximate access to the storage array 510 and is aware of the architecture thereof in terms of banks, rows, columns, and three-dimensional memory vias. Accordingly, the fault module 110 can produce the memory fault map 116 locally at the memory 108 as described above with reference to FIG. 3. This includes condensing the fault information to a low-overhead state, which reduces the bandwidth to communicate the fault information from the memory 108 to the host 202. For example, the memory fault map 116 may include multiple fault entries, such as the illustrated fault entry 512. The fault entry 512 can include a fault address 514 and a range indicator 516. As described above, the fault address 514 can specify a single address location in a grid or matrix of storage locations or multiple addresses, such as a row or column. The range indicator 516 can be implemented as a mask to refine or expand a faulty region relative to the fault address 514.

In example operations, the neural network accelerator module 502 transmits to the fault module 110 a request 508 over the interconnect 204, such as over the address path 504 or a command bus (not shown). The request 508 can pertain to a current memory fault map 116. Alternatively, the request 508 can identify a memory fault map 116 that is associated with one or more targeted modified operating parameters. In response to the request 508, the fault module 110 returns the memory fault map 116 to the neural network accelerator module 502 over the interconnect 204, such as over the data path 506. Although the memory fault map 116 is depicted with a single fault entry 512, a memory fault map 116 may include multiple fault entries 512. Thus, the communication of the memory fault map 116 may be performed by transmitting multiple fault entries 512 from the memory 108 to the host 202. An example approach to communicating this information across an interface between the host 202 and the memory 108 is described next with reference to FIG. 6.

The apparatus 500 may be implemented in various manners. For example, the host 202 and the memory 108 may be integrated on a single chip (e.g., a system on chip (SoC)). In such cases, the interconnect 204 is an intra-chip interconnect. Alternatively, the host 202 and the memory 108 may be built on separate integrated circuit chips, modules, or printed circuit boards (PCBs). In such cases, the interconnect 204 is an inter-chip interconnect, such as traces on a PCB or cabling between different discrete server components. Also, the interconnect 204 may be realized in various ways. For example, the address and data paths may be merged, or the interconnect 204 may include a command bus or other control circuitry.

Figure 6:
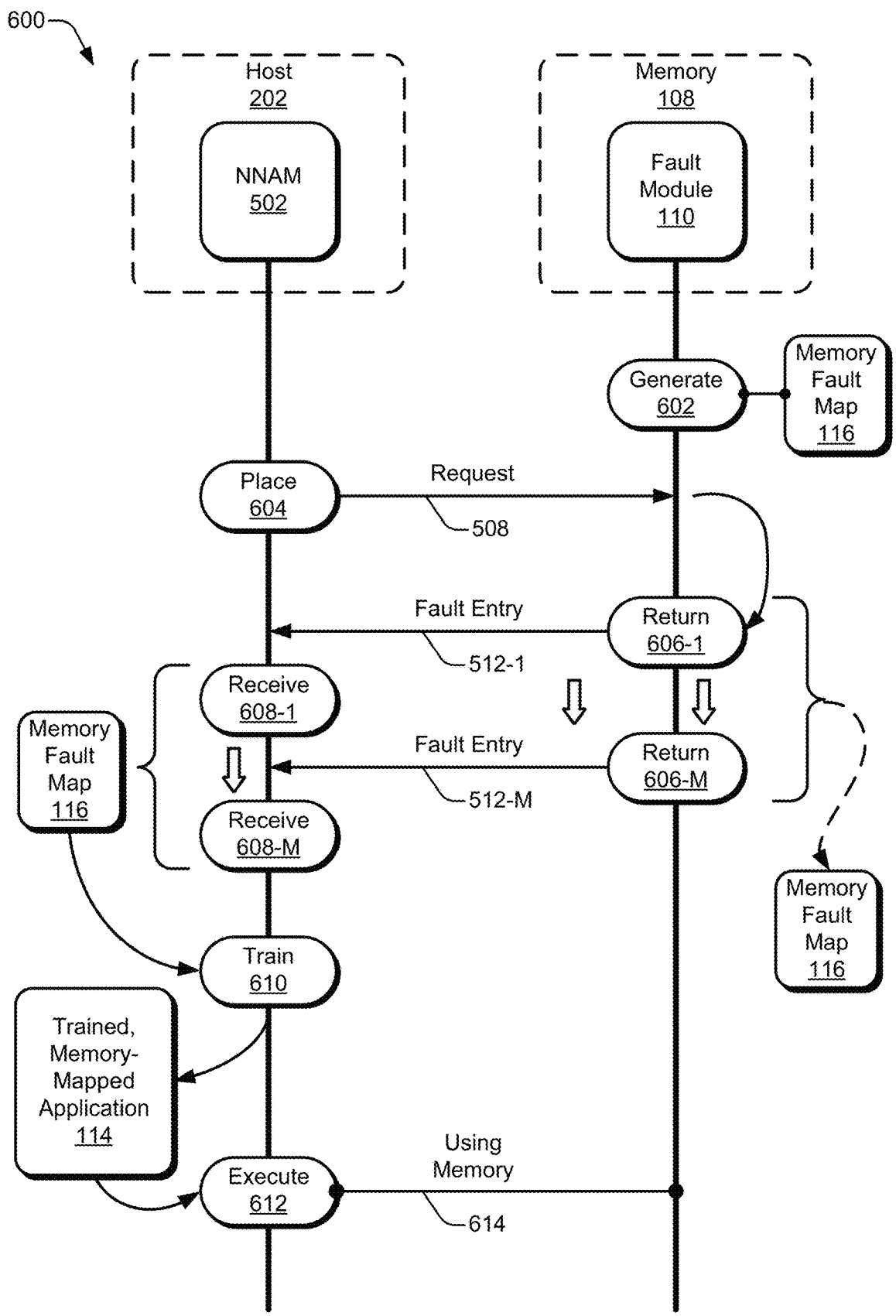
FIG. 6 illustrates an example sequence diagram with operations and communications of a host and a memory to use a memory fault map for an accelerated neural network.

FIG. 6 illustrates an example sequence diagram 600 with operations and communications of the host 202 and the memory 108 to use a memory fault map for an accelerated neural network. At the host 202, the neural network accelerator module (NNAM) 502 performs various operations. At the memory 108, the fault module 110 performs the depicted operations. Although not shown, the neural network accelerator module 502 may initially instruct the memory 108 to operate at some modified operating parameter. At 602, the fault module 110 generates the memory fault map 116 by detecting faults or by converting one or more detected faults into a compact fault entry 512 (or both). The generation may be performed in accordance with the specified modified operating parameter.

At 604, the neural network accelerator module 502 places the request 508 on the interconnect 204. In response to the request 508, the fault module 110 returns the memory fault map 116 at 606. Thus, the neural network accelerator module 502 receives the memory fault map 116 at 608. More specifically, the fault module 110 transmits the memory fault map 116 in multiple parts over time. For example, the fault module 110 returns at 606-1 a fault entry 512-1, and the neural network accelerator module 502 receives at 608-1 the fault entry 512-1. Here, the memory fault map 116 includes M fault entries 512-1 to M, with M representing a positive integer. The exchange of fault entries continues until the fault module 110 transmits the $M^{th}$ fault entry 512-M at 606-M over the interconnect 204.

The neural network accelerator module 502 therefore receives the $M^{th}$ fault entry 512-M at 608-M via the interconnect 204. The neural network accelerator module 502 combines the M fault entries 512-1 to M into the memory fault map 116 at the host 202. At 610, the neural network accelerator module 502 (e.g., using the fault mitigation trainer 402 of FIG. 4) trains a memory-mapped application 404 to produce the trained, memory-mapped application 114. For example, the neural network accelerator module 502 can train a neural network with the memory fault map 116 to produce a hardened neural network that deemphasizes use of an error region in the memory 108 during execution of the hardened neural network, with the error region being indicated by the memory fault map 116. The neural network accelerator module 502 can execute the trained, memory-mapped application 114 at 612. For example, the neural-network accelerator 102 of FIG. 1 can execute the trained, memory-mapped application 114 using the memory 108 at 614 under at least one associated modified operating parameter.

Although FIGS. 5 and 6 are described in terms of a neural network accelerator module for neural network applications, the principles are applicable to other structures and memory-mapped applications generally.

Example Methods

This section illustrates example methods, which may operate separately or together in whole or in part. Various example methods are described, each set forth in a subsection for ease of reading; these subsection titles are not intended to limit the interoperability of each of these methods, one with the other.

Creating or Altering a Memory Fault Map

Figure 7:
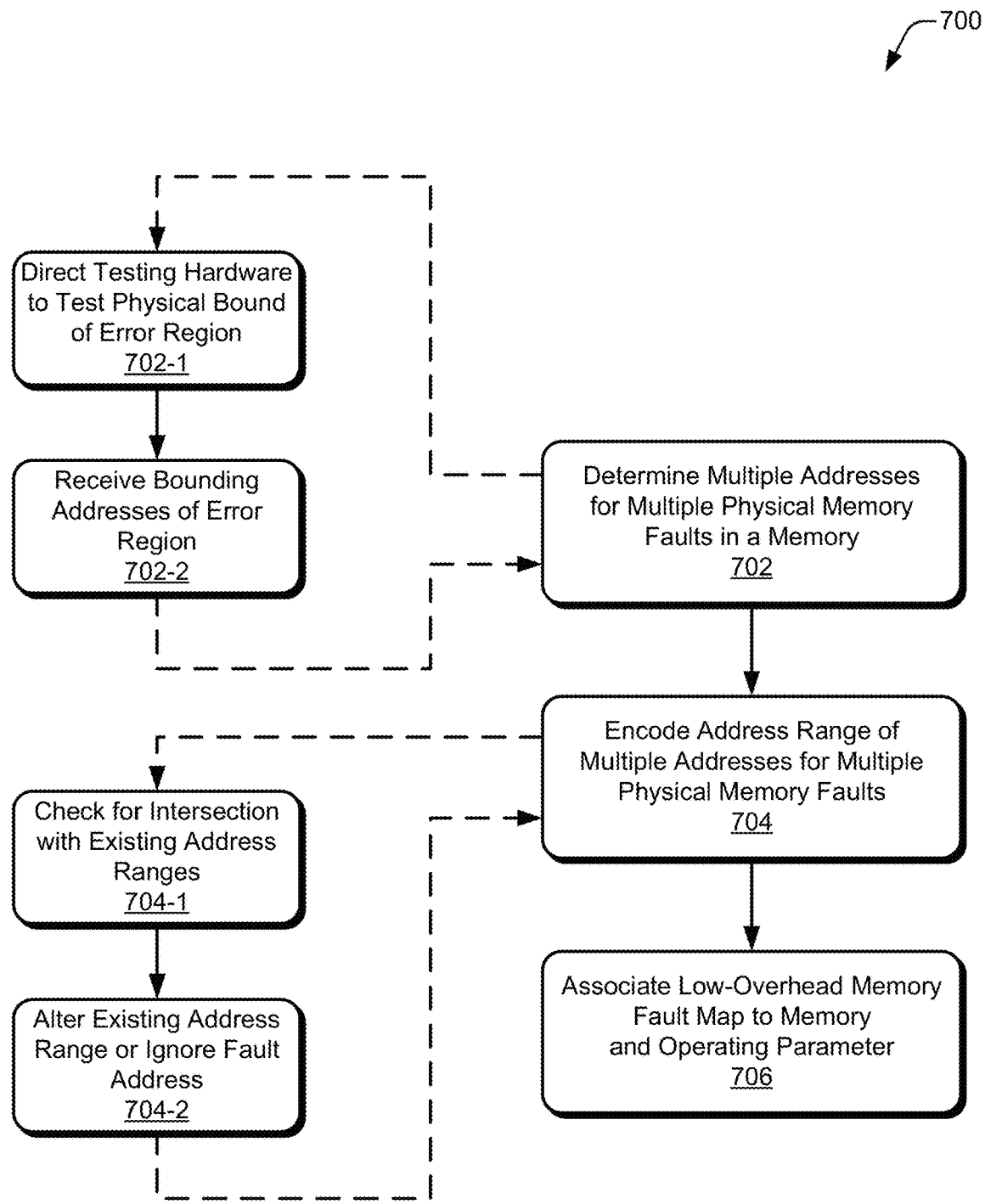
FIG. 7 depicts an example method for creating a memory fault map for future training of a memory-mapped application.

FIG. 7 depicts an example method 700 for creating a memory fault map for future training of a memory-mapped application. In portions of the following discussion, reference may be made to the example operating environment 100 of FIGS. 1 through 4, or to entities or processes as detailed in other figures, reference to which is made for example only.

At 702, multiple addresses for multiple physical memory faults in a memory are determined. These multiple addresses can be determined when a memory is operated at a modified operating parameter that is different from a baseline operating parameter of the memory. In some cases, however, the memory is one in which high performance but high error rates are present at baseline operating parameters, such as a fast-and-dense memory noted above. Thus, the memory fault map can be created for various operating parameters, whether those are modified from a baseline or are baseline operating parameters themselves. While not required, the determination of a fault can include identifying a hard-fault error or a transient-fault error for each of the multiple physical memory faults. A hard fault can be identified if, for instance, an ECC check fails and the bit continues to respond with an incorrect value after being written again. This hard-fault error can have various error rates above a threshold error rate (e.g., 90, 95, or 99 percent) or simply be a single known error. Transient faults are those memory locations that fail an ECC check but are then correctly written to and read from afterwards. Such transient faults can also be included in the memory fault map as potentially erroneous memory locations.

Referencing the example components of FIGS. 1 through 4 as examples, at 702 the fault module 110, with or without assistance from the error detection module 118, determines address for physical memory faults. As noted above, faults in the memory can be determined by identifying an error during a read of the memory, such as during execution of some application, shown with the error-detection module 118. This identification of faults and their addresses can be performed through a scrubbing process, where the scrubbing process checks memory locations and their error-correcting codes (if error correction is included within or associated with the memory).

In some cases, the fault module 110 may determine error regions, as illustrated at alternative operations 702-1 and 702-2. In summary, the fault module 110 may determine an error region bit-by-bit to determine outer bounds of the error region or through testing addresses within a region and setting the error region responsive to faults in the region exceeding a number or percentage threshold. In more detail, at alternative operation 702-1 and responsive to determining one of the multiple addresses for the multiple physical memory faults in the memory, testing hardware is directed to test adjacent addresses to determine a physical bound to an error region having the determined one of the multiple addresses. At alternative operation 702-2, bounding addresses for the error region are received from the testing hardware. These bounding addresses indicate an outer bound of the error region, where the error region has multiple physical memory faults at the modified operating parameter at which the memory is being analyzed.

At 704, an address range is encoded in a memory fault map. This address range includes at least two of the multiple addresses of the multiple physical memory faults determined to be in the memory at operation 702. As noted herein, the encoding stores, in the memory fault map 116, multiple fault addresses with an address range. After one or more iterations of this process of determining addresses for physical memory faults and encoding them, often a particular modified operating parameter, a memory fault map is created (or altered) and ready for use to train a memory-mapped application, such as the memory-mapped application 404 of FIG. 4.

Alternatively or in addition, at 704 encoding is performed including alternative operations at 704-1 and 704-2. At alternative operation 704-1, responsive to determination of an address for a single physical memory fault and prior to encoding the address range, the address is checked against an existing address range in the memory fault map. By so doing, an intersection between an address for a physical memory fault can be found against current entries in the memory fault map. At 704-2, responsive to determination of the intersection (e.g., an address covered by an address range, and thus an overlap) between the address for the single physical memory fault and an address range in the memory fault map, the encoding either ignores the address or alters the existing address range in the memory fault map. If the address is fully within the address range, the encoding operation is moot, as the address is ignored. If the address intersects part of the address range (e.g., part of a row or column but not within the range of that row or column), at 704 the existing address range is altered to increase the range. This is but one way in which a fault map can be improved, such as one that includes faults at baseline operating parameters but is improved to include additional faults determined at modified operating parameters.

At 706, the memory fault map is associated with the operating parameter and memory. The memory fault map is effective to enable future use in training the memory-mapped application to reduce sensitivity, at the modified operating parameter, to the multiple physical memory faults (or to train it to handle errors at baseline operating parameters for a memory that has numerous errors, such as some fast-and-dense or inexpensive memories). Note that the memory fault map is also associated with a particular memory or memories, and therefore generally also to a particular neural network accelerator. Thus, use of the memory fault map trains an application to a particular memory, such as the memory 108 associated with the processor 104 and/or the neural-network accelerator 102.

Training an Application Using the Memory Fault Map

Figure 8:
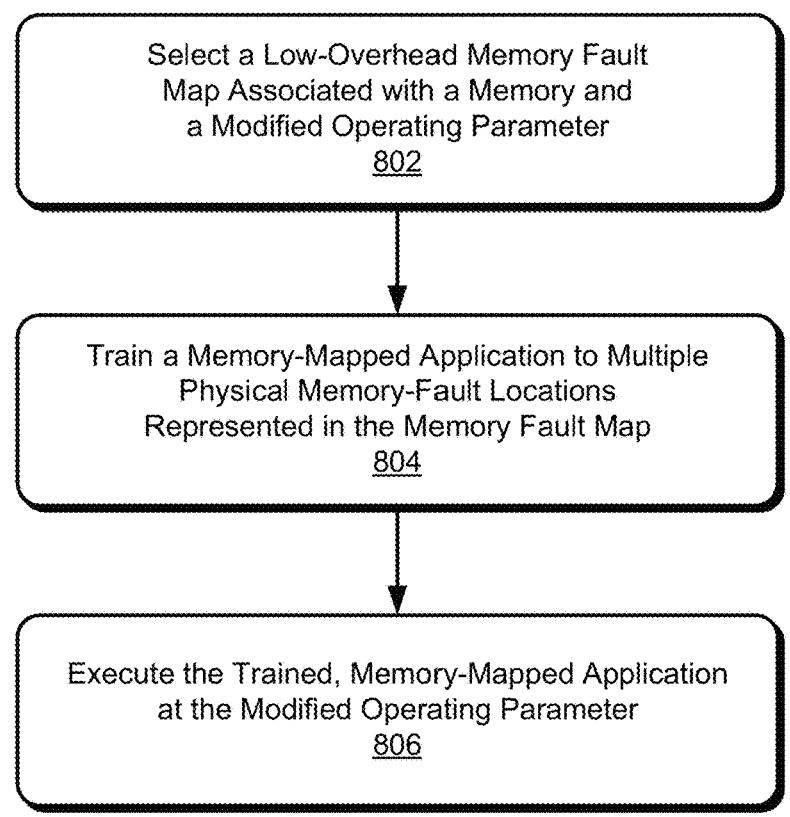
FIG. 8 depicts an example method for training a memory-mapped application using the memory fault map created by the method of FIG. 7.

FIG. 8 depicts an example method 800 for training a memory-mapped application using the memory fault map created at method 700. In portions of the following discussion, reference may be made to the example operating environment 100 of FIGS. 1 through 4, or to entities or processes as detailed in other figures, reference to which is made for example only. The techniques are not limited to performance by one entity or multiple entities operating on one device, such as a single neural-network accelerator.

At 802, a memory fault map associated with a modified operating parameter is selected for a memory. The memory fault map is associated with the modified operating parameter at which a memory-mapped application may later be executed. While a single memory fault map can be available for selection, there can be numerous memory fault maps associated with different modified operating parameters and different memories. As noted in detail above, the modified operation parameters can be of many types, such as high-frequency access, low-voltage storage, high temperature, and others, such as baseline parameters where the memory, at baseline, includes numerous faults.

At 804, the memory-mapped application is trained to multiple physical memory faults represented in the memory fault map. These physical memory faults can be those in addition to faults present at baseline operating parameters, and in such a case the training may be to harden an already-trained application, thereby retraining it to compensate for additional physical memory faults. As noted above, the memory-mapped application can be a neural-network application. In such a case, the training includes retraining one or more neural-network nodes to reduce the weight of those nodes that are mapped to the multiple physical memory faults represented in the memory fault map. Various manners of training an application are also described above, including fast and efficient identifications of intersections between address ranges within the memory fault map and addresses for locations in the memory to which the application has a fixed mapping.

At 806, the trained, memory-mapped mapped application is executed using the memory while the memory is operating within a threshold range of the modified operating parameter. Thus, if the memory fault map is associated with a particular operating parameter, such as a memory operating at a 1200 MHz frequency, the trained application is executed with the memory operating at more than five, ten, or even twenty percent above the 1200 MHz frequency. The trained application can be executed with or without a virtual mapping so long as the physical memory fault locations at which the application was trained are the memory locations at which the trained application is executed.

By way of one example apparatus in which method 800 can operate, consider FIG. 1. Here, the neural-network accelerator 102 executes the trained, memory-mapped application 114 by the processors 104, using the memory controller 106, and at operating parameters for the memory 108 at which the application was trained. Alterations to the memory fault map 116 for that operating parameter can be made or recorded for later alteration by the error detection module 118.

The entities of FIGS. 1 to 6 may be further divided, combined, and used along with their components. In this way, different implementations of the neural-network accelerator 102, the memory 108, the fault module 110, the memory fault map 116, and the memory-mapped application 404 can be used. The example operating environment 100 of FIG. 1 and the detailed illustrations of FIGS. 2 to 6 illustrate but some of many possible environments and devices capable of employing the described techniques. Furthermore, the methods described in this document are shown as sets of blocks that specify operations performed but are not necessarily limited to the order or combinations shown for performing the operations by the respective blocks. Any of one or more of the operations may be repeated, combined, reorganized, or linked to provide a wide array of additional and/or alternate methods, including with other methods described herein. The techniques are not limited to performance by one entity or multiple entities operating on one device, such as a single neural-network accelerator.

Computer-readable media includes both non-transitory computer storage media and communication media including any medium that facilitates transfer of a computer program, such as an application, fault module, or fault map, from one entity to another. Non-transitory storage media can be any available medium accessible by a computer, such as RAM, ROM, EEPROM, compact disk ROM, and magnetic disk.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations of techniques for, and apparatuses enabling, creation and use of a memory fault map for an accelerated neural network have been described in language specific to features and/or methods, it is to be understood that the subject of the appended claims is not necessarily limited to the specific features or methods described. Rather, the specific features and methods are disclosed as example implementations enabling creation and/or use of a memory fault map for an accelerated neural network.

What is claimed is:

1. An apparatus comprising:
   one or more computer processors;
   computer-readable media having instructions stored thereon that, responsive to execution by the one or more computer processors and to create a memory fault map, implements a fault module configured to:
   determine multiple addresses for multiple physical memory faults in a memory when the memory is operated at an operating parameter, the operating parameter different from a baseline operating parameter of the memory;
   encode an address range in the memory fault map, the address range including at least two of the multiple addresses of the multiple physical memory faults determined to be in the memory;
   test adjacent addresses of one of the multiple physical memory faults to determine a physical bound to an error region;
   encode bounding addresses of the error region in the memory fault map; and
   associate the memory fault map to the operating parameter.

2. The apparatus of claim 1, wherein the bounding addresses of the error region indicate an outer bound of the error region, the error region having the one of the multiple physical memory faults and one or more other physical memory faults.

3. The apparatus of claim 1, wherein the error region includes at least one bit not determined to be a physical memory fault.

4. The apparatus of claim 1, wherein the fault module is further configured to:
   test adjacent addresses, one bit at a time, each bit neighboring the one of the multiple physical memory faults until a non-error bit is determined at each bound of a same column of the memory, a same sense circuitry of the memory, a same program circuitry of the memory, a same refresh circuitry of the memory, or a same via of the memory in which the one of the multiple physical memory faults resides.

5. The apparatus of claim 1, wherein, to determine the multiple addresses for the multiple physical memory faults in the memory, the fault module is further configured to:

test addresses within a region having one of the multiple physical memory faults to determine if other faults are within the region;

responsive to a number of the other faults exceeding a number or percentage threshold, determine that the region is an error region; and encode the address range to include the error region.

6. The apparatus of claim 5, wherein, to test the addresses within the region, the fault module is further configured to test:

a row of the memory;
a column of the memory;
a bank of the memory; or
addresses along a via of the memory.

7. The apparatus of claim 1, wherein the fault module is further configured to:

responsive to determining one of the multiple addresses for the multiple physical memory faults in the memory, direct testing hardware to test adjacent addresses to determine a physical bound to an error region having the determined one of the multiple addresses;

receive, from the testing hardware, bounding addresses for the error region, the bounding addresses indicating an outer bound of the error region, the error region having multiple physical memory faults at the modified operating parameter; and encode the address range to include the error region.

8. The apparatus of claim 1, wherein the fault module is further configured to:

encode the address range as a single map entry.

9. The apparatus of claim 8, wherein, to encode the address range as the single map entry, the fault module is further configured to:

encode the single map entry with two integers, a first integer corresponding to a memory address and a second integer corresponding to a mask, the mask indicative of a range of multiple addresses relative to the memory address.

10. The apparatus of claim 8, wherein the address range is represented by two integers, one of the two integers corresponding to a mask indicative of a row, column, or bank in the memory.

11. The apparatus of claim 1, wherein, to determine the multiple addresses for multiple physical memory faults, the fault module is further configured to:

identify a hard-fault error for each of the multiple physical memory faults, the hard-fault error having an error rate above a threshold error rate.

12. The apparatus of claim 11, wherein determining each of the multiple addresses is performed during or immediately after identifying the hard-fault error during a read of the memory.

13. The apparatus of claim 1, wherein, to determine each of the multiple addresses, the fault module is further configured to:

perform a scrubbing process, the scrubbing process checking memory locations and their error correcting codes.

14. The apparatus of claim 1, wherein multiple physical memory faults determined while the memory is operated at the operating parameter are faults not found in a baseline fault list associated with the memory while operated at the baseline operating parameter.

15. The apparatus of claim 1, wherein the operating parameter is a high-frequency memory access, the high-frequency memory access higher than a baseline-frequency memory access of the memory, the baseline-frequency memory access of the memory at which the memory is designed to operate within bounded error rates.

16. The apparatus of claim 1, wherein the operating parameter is a low-voltage memory storage, the low-voltage memory storage lower than a baseline-voltage memory storage of the memory, the baseline-voltage memory storage of the memory at which the memory is designed to operate within bounded error rates.

17. The apparatus of claim 1, wherein the fault module is further configured to:

responsive to determining an address for a single physical memory fault and prior to encoding the address range encompassing the address for the single physical memory fault, check the address against an existing address range in the memory fault map for an intersection; and responsive to determining the intersection:
if the address for the single physical memory fault is fully within the existing address range, refraining from encoding the address; or
if the address is not fully within the existing address range, altering the existing address range in the memory fault map to include the address for the single physical memory fault.

18. The apparatus of claim 1, wherein the one or more computer processors comprise one or more of:

a host computer device central processing unit;
a processor configured for execution of a memory-mapped application operating with a neural-network accelerator; or
a memory controller.

19. The apparatus of claim 1, wherein the memory is a main memory for a neural network accelerator.

20. The fault module of claim 1, wherein the memory includes one or more of a DRAM, SRAM, or flash memory.

* * * * *